United States Patent [19]
Harris

[11] Patent Number: 6,127,725
[45] Date of Patent: Oct. 3, 2000

[54] THIN FILM ELECTRONICS ON INSULATOR ON METAL

[76] Inventor: Ellis D. Harris, 1646 Lynoak Dr., Claremont, Calif. 91711

[21] Appl. No.: 09/128,107

[22] Filed: Aug. 3, 1998

[51] Int. Cl.$^7$ ............................ H01L 23/02; H01L 23/34; H01L 21/44; H01L 21/48; H01L 21/50
[52] U.S. Cl. ........................... 257/686; 257/712; 438/109
[58] Field of Search ........................... 438/109; 257/347, 257/706, 712, 717, 686

[56] References Cited

U.S. PATENT DOCUMENTS

| | | | |
|---|---|---|---|
| 4,788,627 | 11/1988 | Ehlert et al. | 361/386 |
| 4,896,205 | 1/1990 | Weber | 357/81 |
| 4,926,242 | 5/1990 | Itoth et al. | 357/81 |
| 5,587,882 | 12/1996 | Patel | 361/705 |

*Primary Examiner*—Brian Dutton

[57] ABSTRACT

An electronics module consists generally of a refractory metal sheet coated with a refractory insulator film which in turn is coated with a film of silicon within which thin film transistor electronics circuits are further generated along with interconnection means. Particulate matter is deposited in a desired pattern by a printing process and then fused into smooth thin films by means of an infrared laser. Insulator particles are first deposited onto the refractory metal sheet and then melted and fused into a smooth film adhered to the metal sheet. Silicon particles are next deposited on the insulator film and melted and crystallized into electronic quality silicon film. TFT electronics are next generated in the silicon by well-known means. A plurality of individual modules can be disposed in patches over an extended area both conserving material and providing mechanical flexibility as required by certain applications. Additionally, a plurality of individual modules can be arranged in a stack together with interconnection and cooling means resulting in a three-dimensional VLSI integrated circuit.

20 Claims, 4 Drawing Sheets

THIN FILM ELECTRONICS ON INSULATOR ON METAL

BACKGROUND OF THE INVENTION

The present invention relates generally to thin film silicon-on-insulator-on metal electronic circuitry, and more particularly, to thin film transistor electronics fabricated in a silicon film on a refractory insulator film adhered to a refractory metal sheet and additionally wherein the insulator is generated by thermal fusion of refractory insulator particles deposited as a coating on the refractory metal sheet and also wherein the silicon film is generated by the fusing and crystallization of silicon particles deposited as a coating on the insulator film.

In a first approach a xerographic type system is utilized to deposit an image of fine fused silica glass particles onto the refractory metal. These glass particles are then fused into a homogeneous fire polished film by an infrared laser. A second approach utilizes ink jet printing technology to deposit an image of fine fused silica glass particles onto the refractory metal sheet. A subsequent imaging process deposits fine particles of electronic grade silicon on the glass film. The silicon is then fused and crystallized into electronically useful silicon by means of a scanning infrared laser. Subsequent processing, common to VLSI circuit fabrication, then generates the desired electronic circuitry within and upon the surface of the silicon. A dielectric overcoat on top of the processed silicon then provides physical protection and also serves as a substrate for interconnections. Other approaches for the deposition of an image of particulate material include offset printing and screen-printing.

Alternate and optional refractory insulator materials include other glasses, including borosilicate glass (i.e. PYREX), mixed particles of various glasses, and also sapphire. Alternate and optional refractory metals include tantalum and titanium.

One particular benefit of the fabrication technique of the present invention is that it provides for the stacking of many thin circuit layers to comprise an affective three-dimensional VLSI integrated circuits. The metal sheet in each stack serve the additional function of efficiently conducting waste heat into a heat sink.

A further benefit of the invention is that it provides for the deposition of the insulator and silicon in patterns in accordance with a predetermined image and the subsequent fabrication of silicon electronics in the patterns. As an example the pattern can comprise a plurality of patches over a large area metal sheet. By this means electronic circuitry can be fabricated over an extended area using only modest amounts of insulator and silicon, the insulator and silicon being positioned just where electronics are required. Sizes of patches can be kept small expanding the range of acceptable materials having different thermal expansion characteristics. Circuits having mechanical flexibility can be provided since the rigid patches of glass and silicon will be separated and surrounded by flexible metal sheet which can optionally, be comprised of very thin foil.

Fused silica glass and sapphire have commonly been the materials of choice for the insulator in silicon-on-insulator applications. These materials exhibit thermal characteristics which are superior to those of ordinary glasses and which are compatible with silicon, allowing deposited or grown silicon to be recrystallized at high temperatures whereby the resulting forms of silicon exhibit superior performance. The relative high cost of bulk fused silica or sapphire in prefabricated substrates, however, limits the use of these materials to all but very special applications. In the present invention desired circuit functions is achieved without the need of a separate insulator substrate. The insulator is generated in situ from particulate material as an integral part of the process. The need to pre-fabricate a refractory insulator substrate is eliminated and a cost benefit achieved. Similarly, the silicon on the insulator is generated in situ from particulate silicon and then only at positions of actual need.

In the approach of the present invention a number of advantages are exhibited over conventional fabrication of silicon-on-insulator. (I) For a given application, the total bulk of the insulator and the silicon are reduced, these materials being utilized in thin films and then only at specific locations where electronics are desired. (II) The need is eliminated to prefabricate a high quality insulator or window upon which thin-film-transistor (TFT) electronics are subsequently fabricated for certain applications. (III) Epitaxial growth of amorphous silicon on an insulator is a very slow process and constitutes a production bottleneck in many important cases. This slow growth process is eliminated in the present invention. (IV) The net thickness of a module incorporating TFT electronics on silicon-on-insulator on a refractory metal sheet is greatly reduced over that other of methods of fabricating silicon-on-insulator electronics. A direct benefit of this feature is that a plurality of circuit modules can be assembled into a stack comprising a three-dimensional VLSI integrated circuit thereby providing an increase in circuit packing density with its consequent increase in functionality and speed. The metal sheet provides an efficient thermal path for cooling which further facilitates high circuit density and high functionality. (V) Computer or television displays are typically several inches or a few tens of inches in extent. In the application of the present invention to TFT electronics for these displays the total amount of active silicon can actually be quite small even though there may be a million or more transistors in the display. Some VLSI circuits contain this many transistors in only a few centimeters. The displays need only a limited amount of silicon but in prior art approaches typically much more silicon is actually utilized since the silicon must cover the extent of the display. In the case of the present invention silicon need not be continuous over the entire display but just the needed silicon can be placed in small patches at specific locations of need. As a result materials utilization efficiency is significantly enhanced.

Fused Silica exhibits the highest melting point of any known glass, 1600° C. Fused Quartz has a slightly higher melting point, 1730° C. but is not a true glass, and is in limited supply. Sapphire melts at about 2040° C. Both Tungsten and Tantalum exhibit melting points well in excess of these values: Tungsten at 3410° C. and Tantalum at 2996° C. Thermal expansion coefficients of these materials are similar: Fused Silica or fused Quartz at $0.6 \times 10^{-6}/°$ C.; Tungsten at $2 \times 10^{-6}/°$ C.; Silicon at $2.33 \times 10^{-6}/°$ C.; Tantalum at $3 \times 10^{-6}/°$ C.; PYREX at $3.25 \times 10^{-6}/°$ C.; and Sapphire at $7.7 \times 10^{-6}/°$ C. Because of their thermal compatibility Tungsten along with Fused Silica is commonly utilized in glass-to-metal seals. Fused silica has a working temperature around 900° C. and is commonly annealed at 1120° C. Each of the discussed insulators is a high absorber of infrared optical energy and is readily melted at the wavelength of the $CO_2$ laser, 10.6 microns. The utilization of this laser at carefully controlled power and energy levels, optionally scanned over the surface allows melting and fusing of fused silica particles into a thin film insulator on the tungsten sheet with minimum effect on the underlying tungsten.

By a similar laser process a coating of particulate silicon on the resulting insulator can be fused and crystallized with negligible adverse effect on the underlying substrates. Surface tension of the glass melt, or crystallization in the case of Sapphire, will assure a smooth insulator surface for the deposition of silicon. Thermal expansion characteristics of the materials being considered are small and are similar. Such differences that do exist can, however, be accommodated by utilizing the silicon and insulator in a plurality of patches on the refractory metal sheet. By this means stress and strain associated with thermal expansion differences will be restricted to acceptably small regions.

Silicon exhibits a melting point of about 1412° C., and is commonly annealed at from 500° C. to 700° C. Silicon has a strong optical absorption in the far infrared, commencing at just the CO2 wavelength and extending into the longer wavelengths. A scanning CO2 laser will melt the silicon particles, forming a melt pool which will follows the scanning laser beam. The silicon will then crystallize from the moving melt pool as it cools. This process is not unlike the zone refining of silicon utilized in some silicon production processes. Optical power and energy provided by said scanning laser beam along with scan parameters are readily adjustable to just those values needed to melt and crystallize the silicon with minimum adverse effect on the underlying insulator film and metal sheet. By the means of a scanning infrared laser, such as the CO2 laser, the silicon particles are fused and crystallized into electronic quality silicon, care being taken to exclude oxygen, nitrogen and any other material which would degrade the silicon.

It is an object of this invention to provide silicon-on-insulator electronics on a refractory metal sheet. It is a further object of this invention to provide silicon-on-insulator electronics in a format whereby much the bulk of the silicon and the insulator is eliminated and whereby the need of a prefabricated insulator substrate is eliminated. It is a further object of this invention to provide electronic circuitry in thin format modules whereby a plurality of modules can be stacked to comprise a three-dimensional VLSI integrated circuit and whereby the metal sheet integral to each module facilitates waste heat removal. It is still another object of this invention to provide patches of silicon-on-insulator electronic circuitry distributed over an extended area wherein the silicon and the insulator are patterned and located only at just those specific positions where electronic circuitry is actually required, thereby achieving an economy of costly materials. It is yet another object of this invention to provide a plurality of patches of thin film transistor electronics on flexible metal foil whereby mechanical flexibility of the array is achieved. It is yet a further object of this invention to provide silicon-on-insulator electronics in a pattern as determined by a stored image. It is yet another object of this invention to provide a process for the fabrication of silicon-on-insulator integrated circuits whereby a glass or other insulator substrate is developed in situ as part of the fabrication process, and need not be supplied as a separate prefabricated substrate. It is still another object of this invention to provide a process for the generation of a silicon thin film on a refractory insulator by means other than epitaxial growth.

Other objects and attainments together with a fuller understanding of the invention will become apparent and appreciated by referring to the following descriptions and claims in conjunction with the accompanying drawings.

SUMMARY OF THE INVENTION

In accordance with the present invention an electronics module consists generally of a refractory metal sheet coated with a refractory insulator film which in turn is coated with a film of silicon within which thin film transistor electronics circuits are further generated along with interconnection means. Particulate matter is deposited in a desired pattern by a printing process and then fused into a smooth thin film by means of an infrared laser. Insulator particles are first deposited onto the refractory metal sheet and then melted and fused into a smooth film adhered to the metal sheet. Silicon particles are next deposited on the insulator film and melted and crystallized into electronic quality silicon film. TFT electronics are next generated in the silicon by well-known means. A plurality of individual modules can be disposed in patches over an extended area both conserving material and providing mechanical flexibility as required by certain applications. Additionally, a plurality of individual modules can be arranged in a stack together with interconnection and cooling means resulting in a three-dimensional VLSI integrated circuit.

BRIEF DESCRIPTION OF THE DRAWINGS

FIG. 5 also represents a circuit module that results from the generation of electronic circuitry within the silicon film.

DESCRIPTION OF THE PREFERRED EMBODIMENT

Figure 1:
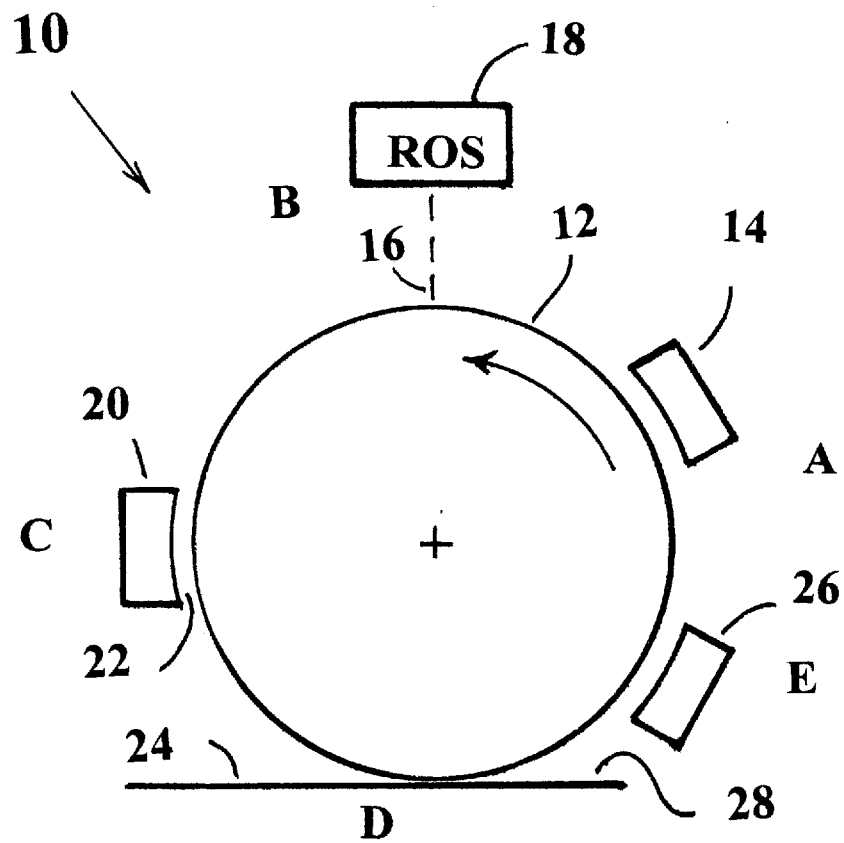
FIG. 1 illustrates a xerographic type apparatus for the deposition of an image of fine particles of either a refractory insulator or silicon onto a refractory metal foil.

Reference is now made to FIG. 1 wherein is represented a system 10 for the deposition of fine fused silica particles onto a tungsten metal sheet 24 in accordance with the present invention by means analogous to the deposition of toner in a xerographic image. This system utilizes charge retentive member in the form of a photoconductive drum 12 consisting of a photoconductive surface and an electrically conductive substrate. This drum surface is mounted for rotation in the direction of the arrow. As the drum rotates points on the surface move past a charging station A, an exposure station B, a development station C a transfer station D and a cleaning station E.

As seen by further reference to FIG. 1 successive surface portions of the drum 12 pass through charging station A, where a corona discharge device indicated generally by the reference numeral 14 charges the drum 12 to a high uniform potential. At exposure station B the uniformly charged photoreceptor of charge retentive surface of the drum 12 is exposed to output optical flux 16 from a laser raster output scanning device (ROS) 18, causing the charge retentive surface to remain charged or to be discharged in accordance with the laser beam output from the scanning device 18. An electronic subsystem, not shown, converts a previously stored image into the appropriate control signals for the laser raster output-scanning device (ROS) 18. The laser beam 16 from the ROS 18 will expose the photoreceptor 12, discharging portions of the photoreceptor in accordance to the previously stored image. This stored image is just that of the area on the metal foil which is to be coated with the refractory insultor.

At development station C, a development system, generally indicated by the reference numeral 20, advances oppositely charged developer material 22 into contact with the latent electrostatic image on the photoreceptor 12. In the preferred embodiment of the present invention this development material 22 consists of fine particles of fused silica, however particles of other refractory insulator materials can, optionally, be employed. At the transfer station D, the charged fused silica articles are transferred to the tungsten foil 24 by electrostatic attraction between the particles and the metal sheet. While tungsten is the preferred metal, other refractory metals can, optionally be utilized. The photoreceptor drum 12 then passes the cleaning station E. Subsequent to cleaning, a discharge lamp, not shown, floods the photoreceptor with light to dissipate any residual electrostatic charge remaining prior to charging for the next imaging cycle.

Figure 2:
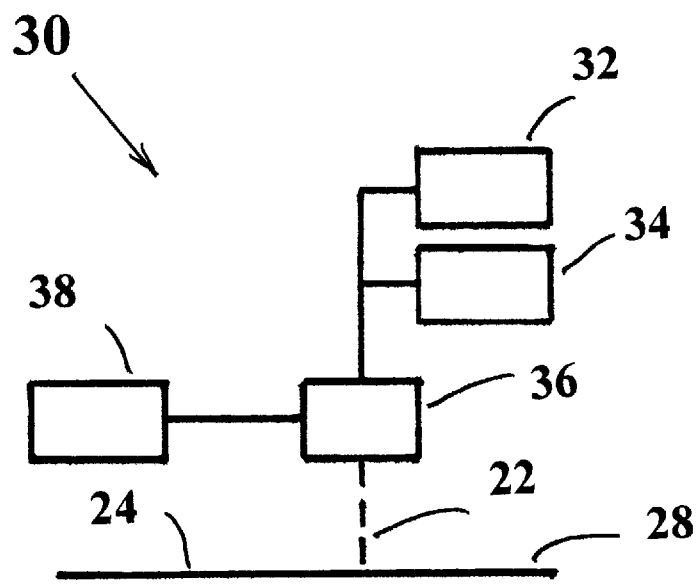
FIG. 2 represents the deposition of the particulate materials using apparatus similar to that of an ink jet printer.

An alternate system 30 for the deposition of fine particles onto the refractory metal sheet is indicated in FIG. 2. The system indicated in FIG. 2 is analogous to an ink jet printing system wherein small toner particles, dispersed in a liquid medium are projected by means of an array of nozzles onto a substrate. In FIG. 2 fused silica particles from a supply 32 are dispersed in a liquid carrier 34 and supplied to nozzle means 36. A controller 38 driven by an electronic system, not shown, controls the deposition, by this means of fused silica particles 22 are deposited on the refractory metal sheet 24 in accordance with a previously stored image.

Alternate methods for the deposition of particulate material on the substrates include offset printing and screen-printing. While fused silica is the preferred refractory insulator other refractory insulator materials can optionally be utilized. Similarly, while tungsten is the refractory metal of preference other refractory metals can optionally be employed.

Figure 3:
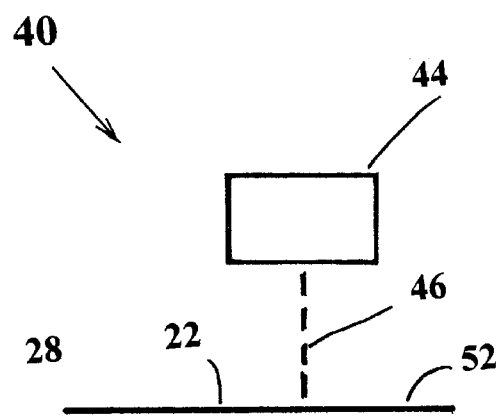
FIG. 3 illustrates a scanning laser approach for fusing and polishing the deposited insulator particulate materials and also for fusing and crystallizing the deposited particulate silicon.

The tungsten sheet containing deposited particles of fused silica 28 is advanced to the fusing station illustrated in FIG. 3. As illustrated in FIG. 3 a scanning infrared laser beam 46 from a CO2 laser ROS 44 melts the fused silica particles 22 causing them to fuse into a smooth continuous glass film 52 adhered to the tungsten sheet 24, shown in FIGS. 3 and 3A. Surface tension of the cooling melt assures a smooth surface and is equivalent to fire polishing of the surface. Fused silica melts at about 1600° C. while the tungsten does not melt until a temperature of about 3410° C. is reached. Careful control of beam power and energy allows the fused silica to be fused into a smooth continuous glass film of the imaged pattern with minimum adverse effect on the underlying tungsten sheet. While the two thermal expansion coefficients are small and are similar, some stress and strain will develop as the films cool. When necessary the stress and strain can be kept within allowable limits by subdividing the glass coating into a plurality patches on the tungsten. While a CO2 laser with 10.6 micron radiation is the preferred laser, other infrared lasers can, optionally be utilized.

Figure 3A:
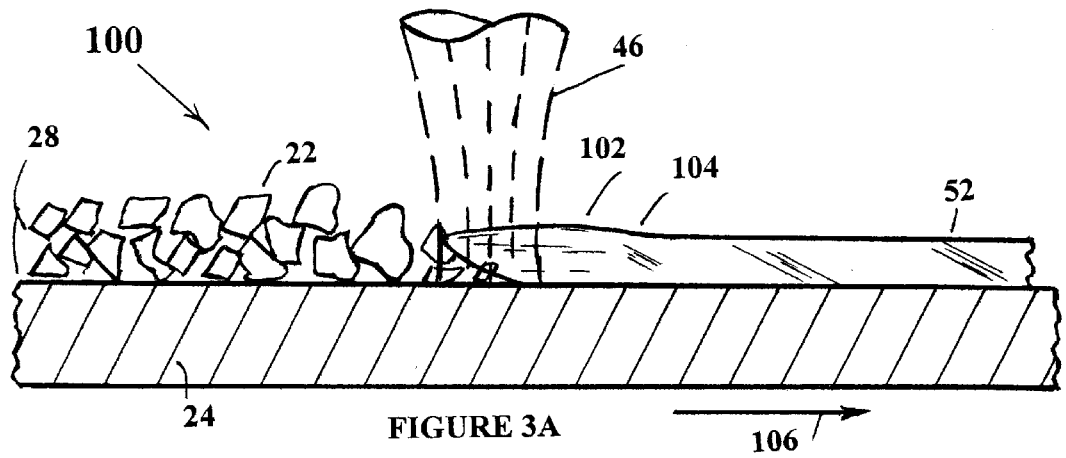
FIG. 3A is an elaboration of FIG. 3 for the fusion of particles of insulator into a refractory insulator film on a refractory metal sheet by means of a scanning infrared laser.
Figure 3B:
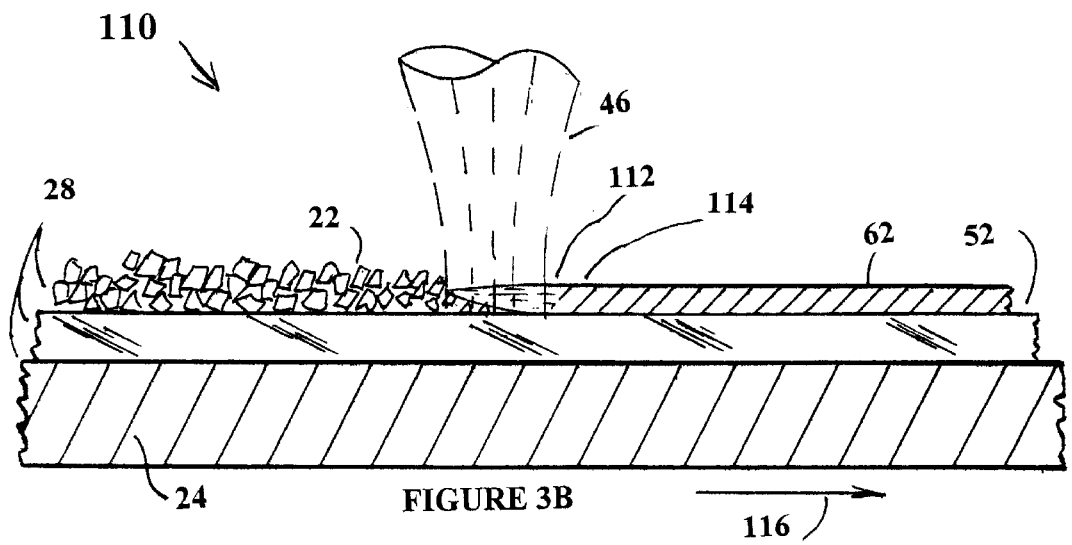
FIG. 3B is another elaboration of FIG. 3 wherein the generation of electronic quality silicon is achieved by thermal fusing and crystallization of deposited silicon particles by means of a scanning infrared laser.
Figure 4:
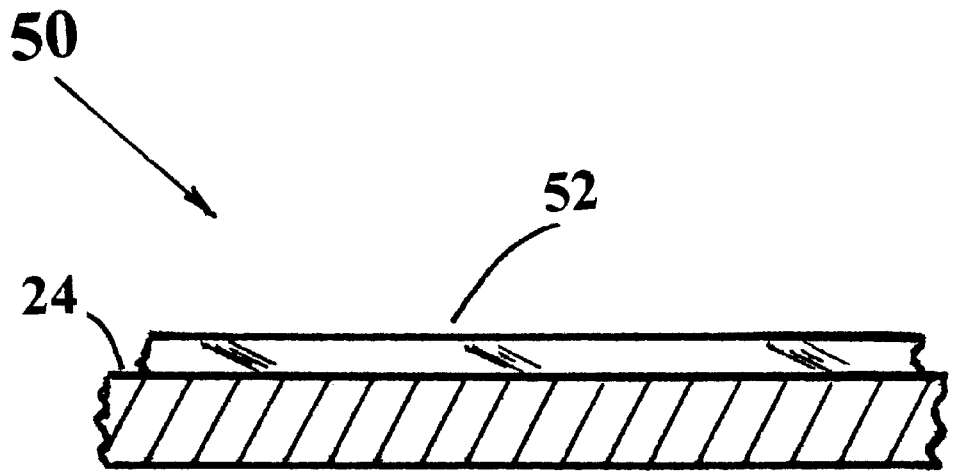
FIG. 4 illustrates a section of the resultant metal sheet with the adhering insulator film.

The process for developing a silicon film over the glass film that has been developed on the tungsten foil is nearly identical to the process for development of the glass film. The essential difference being the use of silicon particles rather than fused silica particles. The discussions pertaining to FIGS. 2, 3A and 4 are directly applicable for the production of a thin silicon film using FIGS. 2, 3B and 5, the particulate material being replaced by silicon. In the case of silicon the melting temperature is about 1412° C. With power and energy of a scanning laser beam closely controlled the silicon particles can be melted and crystallized from the melt with negligible effect on the underlying fused silica glass and tungsten sheet, both of which exhibit a higher working temperature than silicon. Care must be taken to exclude any substance that would degrade the high purity required for electronic circuits.

FIG. 3A elaborates on FIG. 3 for the generation of a refractory insulator film from deposited particles of the insulator. The laser beam 46 is brought to focus on the particles 22 and there is relative motion, indicated by the arrow 106, of the laser beam 46 relative to the particle bearing substrate 28. As a result of the absorption of optical energy from the laser beam 46 the insulator particles are melted, forming a melt pool 102 that follows behind the laser beam. Surface tension of the melt establishes a smooth surface on the cooling glass 104. The glass then cools to comprise a smooth insulator film 52 adhered to the refractory metal 24. FIG. 3B elaborates on FIG. 3 for the generation of a silicon film 62 on the insulator 52. The silicon particles 22 are melted by the scanning laser beam, forming a moving melt pool 112 As the silicon cools from the melt it crystallizes 114 into a thin film adhered to the insulator film 52. This crystallized silicon film serves as the substrate for subsequent processing into thin-film-transistor (TFT) circuitry.

Figure 5:
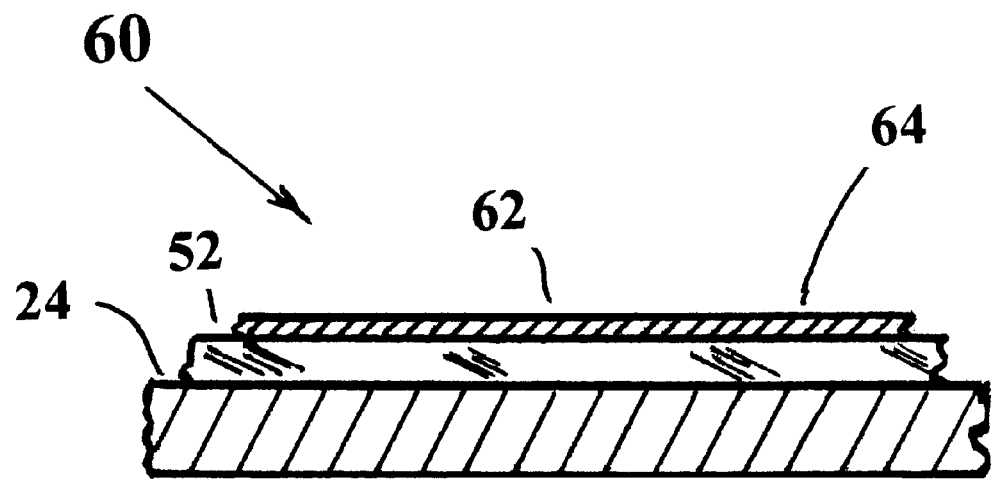
FIG. 5 shows an illustration of a section of the resultant structure comprising refractory metal sheet, glass film, and silicon film.

FIG. 4 is an illustration 50 of the glass film 52 generated on the tungsten sheet 24 as described above. FIG. 5 illustrates a thin film silicon-on-insulator module 60 comprising the tungsten sheet substrate 24 the glass film 52 and the silicon film 62 as generated by the above-described procedures. In a succeeding series of steps, not illustrated, transistor electronic circuits 64 are generated within the silicon film by well-known fabrication means. Screen printing of photoresist materials is particularly applicable to the fabrication process in those cases where spin coating would be difficult.

Figure 6:
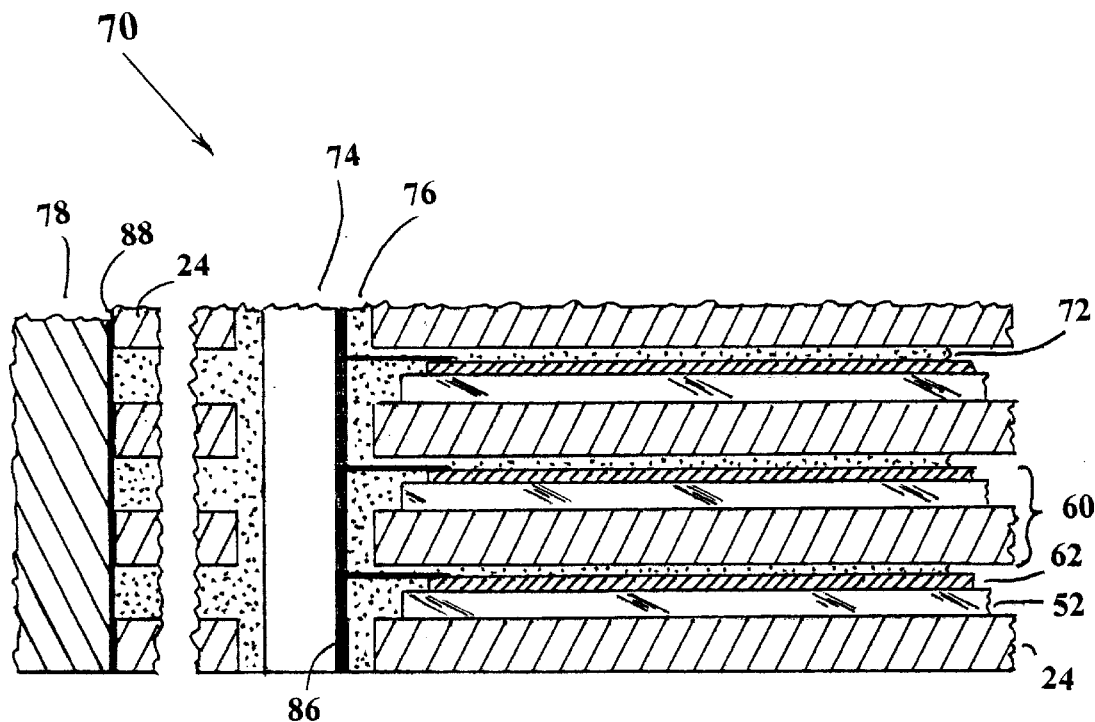
FIG. 6 illustrates stacking of a number of the resulting thin film circuit modules to achieve a three-dimensional VLSI integrated circuit.

FIG. 6 illustrates a stack 70 consisting of a plurality of thin film silicon-on-insulator modules 60 in a stack 70 wherein a three-dimensional VLSI integrated circuit achieved. As show in FIG. 6 modules 60 within stack 70 are spaced and insulated from each other by insulator means 72. Interconnections 86 between the several modules 60 of the stack 70 are facilitated by means of one or more vias 74, each having appropriate insulation 76. A heat sink 78 in close thermal contact 88 with the metal sheet 24 of each module 60 facilitates cooling. By the combination of the metal sheet 24, the thermal contact 88 and the heat sink 78, waste heat is efficiently removed from the heat producing silicon electronic circuitry. The close proximity of a plurality of interconnected VLSI circuit modules 60 together with efficient removal of waste heat as illustrated offers a number of significant benefits in many specific electronic systems. High circuit density and function is achieved, clock skew is mitigated and speed is enhanced. Module testing prior to insertion into the stack is a viable option to enhance circuit reliability of the three-dimensional VLSI integrated circuit.

Figure 7:
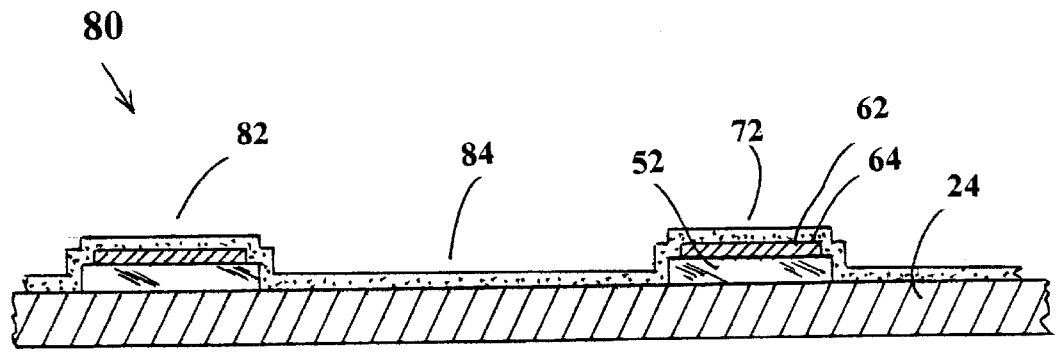
FIG. 7 illustrates a series of circuit module patches distributed over an extended area such as to achieve an economy of insulator and silicon when limited circuit functions are needed.

FIG. 7 illustrates an assembly 80 comprising a plurality of patches 82 of electronic circuitry of silicon-on-insulator distributed over an extended area of refractory metal foil 24 wherein each patch comprises a circuit module composed of a section of glass thin film 52 and a section of silicon film 62 along with its integral TFT electronics 64. An insulating overcoat 72 provides protection and serves as a substrate for electrical interconnections, not shown. Flexible regions 84 separate the circuitry patches 82 and provides mechanical flexibility not otherwise available with brittle glass and silicon. The above described features are of benefit whenever mechanical flexibility is required for a circuit requiring a large number of thin film transistors spread over an extended area as is the case for some visual display approaches. Interconnection means, not shown, establishes connectivity among the plurality of circuit modules 82 and to external sources of power and signal.

While the invention has been described in conjunction with specific embodiments, it is evident to those skilled in the art that many alternatives, variations and modifications will be apparent in the light of the foregoing description. Accordingly, the invention is intended to embrace all such alternatives, variations and modifications as fall within the spirit and scope of the appended claims.

What is claimed is:

1. A thin film electronics module comprising
    a refractory metal sheet upon which is generated in situ a refractory insulator, upon which is generated in situ a coating of silicon upon which is produced an electronics circuit.

2. An assembly of a plurality at least one thin film electronics modules comprising a refractory metal sheet upon which is generated a refractory insulator upon which is generated a coating of silicon upon which is produced electronics circuitry and wherein said insulator, silicon and electronics are distributed as isolated patches over the surface of said refractory metal sheet and wherein connectivity means are included for connectivity between individual electronics modules of said assembly and to external signals.

3. The assembly of electronics modules of claim 2 wherein said refractory metal sheet is comprised of Tungsten.

4. The assembly of electronics modules of claim 2 wherein said refractory metal sheet is comprised of Tantalum.

5. The assembly of electronics modules of claim 2 wherein said refractory insulator is composed of fused silica.

6. The assembly of electronics modules of claim 2 wherein said refractory insulator is composed of glass.

7. The assembly of electronics modules of claim 2 wherein said refractory insulator is composed of a mixture of refractory glasses.

8. The assembly of electronics modules of claim 2 wherein said refractory insulator is composed of sapphire.

9. The assembly of electronics modules of claim 2 wherein said refractory insulator is composed of fused quartz.

10. The assembly of isolated electronics modules of claim 2 wherein said plurality of refractory insulator films, each with its overcoat of silicon electronics, are distributed as a number of separate patches over an extended area of said refractory metal sheet.

11. The assembly of electronics modules of claim 10 wherein mechanical flexibility of said assembly results from the flexibility of those regions of said metal sheet which are devoid of patches of electronics modules.

12. A plurality of at least one of the assemblies of electronics modules of claim 2 wherein said plurality is disposed in a stack whereby a three-dimensional VLSI integrated circuit is at least approximated.

13. The stack of assemblies of claim 12 wherein is included interconnection means whereby said plurality of assemblies within said stack are interconnected.

14. The stack of assemblies of claim 13 wherein is further included heat sink means whereby waste heat is removed.

15. A process for the generation of the electronics modules of claim 2 wherein an at least approximate uniform coating of refractory insulator particles is deposited in a plurality of at least one patch on said metal sheet and subsequently fused into a plurality of at least one patch comprising an at least approximately smooth and uniform continuous refractory insulator film and,
    wherein an at least approximate uniform coating of silicon particles are deposited upon the said plurality of patches of fused refractory insulator film and subsequently fused and crystallized into an at least approximate smooth and uniform coating of silicon.

16. The process of claim 15 wherein said particulate matter is deposited by means similar to the means for the deposition of toner in a xerographic printing system.

17. The process of claim 15 wherein said particulate matter is deposited by means similar to the means for the deposition of matter in an ink jet printing system.

18. The process of claim 15 wherein said particulate matter is deposited by means similar to the means for the deposition of ink in an offset printing system.

19. The process of claim 15 wherein said particulate matter is deposited by means similar to the means for the deposition of ink in an ink screen printing system.

20. The process of claim 15 wherein said fusing of said particulate matter is accomplished by means of a laser and wherein said insulator particles are fused at temperatures below the working or melting temperature of said underlying refractory metal and wherein said silicon particles are fused and crystallized at temperatures below the softening or melting or working temperatures of said underlying refractory insulator film or said underlying refractory metal.

* * * * *